US012748139B2

(12) United States Patent
Xiao et al.

(10) Patent No.: US 12,748,139 B2
(45) Date of Patent: Sep. 29, 2026

(54) POWER CONVERSION SYSTEM AND CONTROL METHOD THEREFOR

(71) Applicant: ZHEJIANG JINKO ENERGY STORAGE CO., LTD., Haining (CN)

(72) Inventors: Qi Xiao, Haining (CN); Yaoshen Tan, Haining (CN); Luhua Zhang, Haining (CN)

(73) Assignee: ZHEJIANG JINKO ENERGY STORAGE CO., LTD., Haining (CN)

( * ) Notice: Subject to any disclaimer, the term of this patent is extended or adjusted under 35 U.S.C. 154(b) by 130 days.

(21) Appl. No.: 18/937,649

(22) Filed: Nov. 5, 2024

(65) Prior Publication Data

US 2025/0062684 A1 Feb. 20, 2025

(30) Foreign Application Priority Data

Aug. 9, 2024 (CN) ......................... 202411092284.1

(51) Int. Cl.
*G01R 27/26* (2006.01)
*G01R 27/02* (2006.01)

(52) U.S. Cl.
CPC ....... *G01R 27/2623* (2013.01); *G01R 27/025* (2013.01); *G01R 27/2617* (2013.01)

(58) Field of Classification Search
CPC .. G01R 27/14; G01R 27/2623; G01R 27/025; G01R 27/2617
See application file for complete search history.

(56) References Cited

U.S. PATENT DOCUMENTS

| | | | | |
|---|---|---|---|---|
| 2017/0297447 | A1* | 10/2017 | Tzivanopoulos | B60L 3/0069 |
| 2017/0334295 | A1* | 11/2017 | Turner | G01R 27/025 |
| 2022/0120796 | A1* | 4/2022 | Fu | G01R 35/00 |
| 2022/0203838 | A1* | 6/2022 | Ham | B60L 3/0038 |
| 2024/0103087 | A1* | 3/2024 | Lander | G01R 31/3835 |
| 2025/0251466 | A1* | 8/2025 | Mizoguchi | G01R 31/52 |

FOREIGN PATENT DOCUMENTS

| | | | |
|---|---|---|---|
| CN | 208109933 | U | 11/2018 |
| CN | 109521277 | A | 3/2019 |
| CN | 115356540 | A | 11/2022 |
| CN | 219224940 | U | 6/2023 |
| CN | 117647676 | A | 3/2024 |
| CN | 118311457 | A | 7/2024 |

* cited by examiner

*Primary Examiner* — Gary L Laxton
(74) *Attorney, Agent, or Firm* — Ballard Spahr LLP

(57) ABSTRACT

Disclosed are a power conversion system and a control method therefor. The power conversion system includes a first voltage-dividing circuit, a second voltage-dividing circuit, a switch module, a control module, and a detection module. The first voltage-dividing circuit includes a first circuit, a third circuit and a first insulation impedance connected in parallel between a positive electrode of the power conversion system and the ground. The second voltage-dividing circuit includes a second circuit, a fourth circuit, and a second insulation impedance connected in parallel between the ground and a negative electrode of the power conversion system. The switch module is arranged in at least one of the first voltage-dividing circuit and the second voltage-dividing circuit. The control module is connected to the switch module. The detection module is connected to the first voltage-dividing circuit or the second voltage-dividing circuit.

20 Claims, 4 Drawing Sheets

POWER CONVERSION SYSTEM AND CONTROL METHOD THEREFOR

CROSS-REFERENCE TO RELATED APPLICATION

The present application claims the priority of Chinese patent application No. 202411092284.1, filed on Aug. 9, 2024, and entitled "POWER CONVERSION SYSTEM AND CONTROL METHOD THEREFOR", which is incorporated herein by reference in its entirety.

TECHNICAL FIELD

The present disclosure relates to the field of power conversion systems, and in particular to a power conversion system and a control method therefor.

BACKGROUND

It is very important to detect insulation impedance of the positive and negative busbars of the power conversion system to ground. Too low insulation impedance to ground may cause problems that the system discharges to the ground. In serious cases, a failure of the power conversion system may occur. At present, an insulation impedance detection circuit is usually arranged in the power conversion system.

SUMMARY

The following is a summary of the subject matter described in details in the present disclosure. This summary is not intended to limit the scope of the claims.

In a first aspect, the present disclosure provides a power conversion system, including a first voltage-dividing circuit, a second voltage-dividing circuit, a switch module, a control module, and a detection module.

The first voltage-dividing circuit includes a first circuit, a third circuit and a first insulation impedance connected in parallel between a positive electrode of the power conversion system and the ground.

The second voltage-dividing circuit includes a second circuit, a fourth circuit, and a second insulation impedance connected in parallel between the ground and a negative electrode of the power conversion system. An output terminal of the first circuit is connected to an input terminal of the second circuit, an output terminal of the third circuit is connected to an input terminal of the fourth circuit, and an output terminal of the first insulation impedance is connected to an input terminal of the second insulation impedance.

The switch module is arranged in at least one of the first voltage-dividing circuit and the second voltage-dividing circuit, and a conduction or a disconnection of the at least one of the first circuit and the second circuit is controlled by controlling a conduction or a disconnection of the switch module, and/or a conduction or a disconnection of at least one of the third circuit and the fourth circuit is controlled by controlling the conduction or the disconnection of the switch module.

The control module is connected to the switch module and configured to control the conduction or the disconnection of the switch module to switch a working mode of the power conversion system to be a detection mode or a normal mode.

The detection module is connected to the first voltage-dividing circuit or the second voltage-dividing circuit, and configured to, in the detection mode, detect a resistance value of the first insulation impedance and a resistance value of the second insulation impedance.

In an embodiment, the switch module includes a first switch unit and a second switch unit.

The first switch unit is provided in the first circuit and configured for controlling the conduction or the disconnection of the first circuit.

The second switch unit is provided in the second circuit and configured for controlling the conduction or the disconnection of the second circuit.

The control module is connected to and configured to control the first switch unit, the second switch unit, and the detection module.

In the detection mode, the control module is configured to control the first switch unit to be turned on, control the second switch unit to be turned off, and control the detection module to perform a first detection operation to obtain a voltage Vp1 across the first voltage-dividing circuit and a voltage Vn1 across the second voltage-dividing circuit.

The control module is further configured to control the first switch unit to be turned off, control the second switch unit to be turned on, and control the detection module to perform a second detection operation to obtain a voltage Vp2 across the first voltage-dividing circuit and a voltage Vn2 across the second voltage-dividing circuit.

In the normal mode, the control module is configured to control the first switch unit and the second switch unit to be turned off.

In an embodiment, the detection module is further configured to calculate the resistance value of the first insulation impedance and the resistance value of the second insulation impedance according to:

$$\frac{R1 // (R5 + R6) // Rx}{(R7 + R8) // Ry} = \frac{Vp1}{Vn1}, \text{ and } \frac{(R5 + R6) // Rx}{R4 // (R7 + R8) // Ry} = \frac{Vp2}{Vn2}$$

where, Rx denotes the resistance value of the first insulation impedance, Ry denotes the resistance value of the second insulation impedance, and a sign // denotes a connection in parallel.

R1 denotes a resistance value of a first resistor in the first circuit, R4 denotes a resistance value of a fourth resistor in the second circuit, R5 and R6 denote resistance values of a fifth resistor and a sixth resistor connected in series in the third circuit respectively, and R7 and R8 denote resistance values of a seventh resistor and an eighth resistor connected in series in the fourth circuit respectively.

In an embodiment, the switch module further includes a third switch unit and a fourth switch unit.

The third switch unit is provided in the third circuit and configured for controlling the conduction or the disconnection of the third circuit.

The fourth switch unit is provided in the fourth circuit and configured for controlling the conduction or the disconnection of the fourth circuit.

The control module is connected to and configured to control the third switch unit and the fourth switch unit.

In the detection mode, the control module is configured to control the third switch unit and the fourth switch unit to be turned on.

In the normal mode, the control module is configured to control the third switch unit and the fourth switch unit to be turned off.

In an embodiment, one terminal of the switch module is connected to the ground, and another terminal of the switch module is connected to an output terminal of the first voltage-dividing circuit and an input terminal of the second voltage-dividing circuit.

In the detection mode, the control module is configured to control the switch module to be turned on so that both the first voltage-dividing circuit and the second voltage-dividing circuit are turned on.

In the normal mode, the control module is configured to control the switch module to be turned off so that both the first voltage-dividing circuit and the second voltage-dividing circuit are disconnected.

In an embodiment, the first circuit incudes a first branch circuit, a second branch circuit, a third branch circuit and a first switch component. The first branch circuit is connected to the positive electrode of the power conversion system, the second branch circuit and the third branch circuit are connected to the ground, the second branch circuit and the third branch circuit have different resistance values, and the first switch component is configured to control the first branch circuit to be connected to the second branch circuit or to be connected to the third branch circuit to adjust a total resistance of the first circuit;

The second circuit includes a fourth branch circuit, a fifth branch circuit, a sixth branch circuit and a second switch component. A first terminal of the fourth branch circuit is connected to the negative electrode of the power conversion system, the fifth branch circuit and the sixth branch circuit are connected to the ground, the second switch component is connected to a second terminal of the fourth branch circuit, the fifth branch circuit and the sixth branch circuit have different resistance values, and the second switch component is configured to control the fourth branch circuit to be connected to the fifth branch circuit or to be connected to the sixth branch circuit to adjust a total resistance of the second circuit.

The control module is connected to and configured to control the first switch component, the second switch component and the detection module.

In the detection mode, the control module is configured to control the first switch unit to connect the first branch circuit of the first circuit and the second branch circuit of the first circuit, and configured to control the second switch unit to connect the fourth branch circuit of the second circuit and the sixth branch circuit of the second circuit, and configured to control the detection module to perform a first detection operation to obtain a voltage Vp1 across the first voltage-dividing circuit and a voltage Vn1 across the second voltage-dividing circuit.

The control module is further configured to control the first switch unit to connect the first branch circuit of the first circuit and the third branch circuit of the first circuit, and configured to control the second switch unit to connect the fourth branch circuit of the second circuit and the fifth branch circuit of the second circuit, and configured to control the detection module to perform a second detection operation to obtain a voltage Vp2 across the first voltage-dividing circuit and a voltage Vn2 across the second voltage-dividing circuit.

In an embodiment, the detection module is further configured to calculate the resistance value of the first insulation impedance and the resistance value of the second insulation impedance according to $$\frac{(R1+R2)\,//\,(R5+R6)\,//\,Rx}{R4\,//\,(R7+R8)\,//\,Ry}=\frac{Vp1}{Vn1},\ \text{and}$$

$$\frac{R1\,//\,(R5+R6)\,//\,Rx}{(R3+R4)\,//\,(R7+R8)\,//\,Ry}=\frac{Vp2}{Vn2}$$

Where, Rx denotes the resistance value of the first insulation impedance, Ry denotes the resistance value of the second insulation impedance, and a sign // denotes a connection in parallel.

R1 denotes a resistance value of a first resistor in the first branch circuit of the first circuit, R2 denotes a resistance value of a second resistor in the second branch circuit of the first circuit, R3 denotes a resistance value of a third resistor in the fifth branch circuit of the second circuit, R4 denotes a resistance value of a fourth resistor in the fourth branch circuit of the second circuit, R5 and R6 denote resistance values of a fifth resistor and a sixth resistor respectively connected in series in the third circuit, and R7 and R8 denote resistance values of a seventh resistor and an eighth resistor respectively connected in series in the fourth circuit.

In an embodiment, a test resistor is any one of the fifth resistor, the sixth resistor, the seventh resistor, and the eighth resistor; and the detection module and the test resistor are connected in parallel.

In an embodiment, the switch module includes at least one of a single-pole double-throw switch, a photocoupler, an optocoupler transistor, or a relay.

In a second aspect, the present disclosure provides a control method for a power conversion system of any one of the embodiments above. The control method includes following steps:

- in the detection mode, controlling the third circuit and the fourth circuit to be turned on, controlling the switch module to be turned on so that at least one of the first circuit and the second circuit are turned on, and obtaining the resistance value of the first insulation impedance and the resistance value of the second insulation impedance; and
- in the normal mode, controlling the switch module to be turned off so that the first circuit and the second circuit are both disconnected, and controlling the switch module to be turned off so that the third circuit and the fourth circuit are both disconnected.

In an embodiment, in the detection mode, controlling the third circuit and the fourth circuit to be turned on, controlling the switch module to be turned on so that at least one of the first circuit and the second circuit are turned on, and obtaining the resistance value of the first insulation impedance and the resistance value of the second insulation impedance, includes:

- controlling the first switch unit arranged in the first circuit to be turned on so that the first circuit is turned on, and controlling the second switch unit arranged in the second circuit to be turned off so that the second circuit is disconnected, and performing a first detection operation to obtain a voltage Vp1 across the first voltage-dividing circuit and a voltage Vn1 across the second voltage-dividing circuit; and
- controlling the first switch unit to be turned off so that the first circuit is turned off, and controlling the second switch unit to be turned on so that the second circuit is turned on, and performing a second detection operation to obtain a voltage Vp2 across the first voltage-dividing circuit and a voltage Vn2 across the second voltage-dividing circuit.

In an embodiment, the control method for the power conversion system further includes calculating the resistance value of the first insulation impedance and the resistance value of the second insulation impedance according to:

$$\frac{R1 // (R5+R6) // Rx}{(R7+R8) // Ry} = \frac{Vp1}{Vn1}, \text{ and } \frac{(R5+R6) // Rx}{R4 // (R7+R8) // Ry} = \frac{Vp2}{Vn2}$$

Where, Rx denotes the resistance value of the first insulation impedance, and Ry denotes the resistance value of the second insulation impedance; a sign // denotes a connection in parallel.

R1 denotes a resistance value of a first resistor in the first circuit, R4 denotes a resistance value of a fourth resistor in the second circuit, R5 and R6 denote resistance values of a fifth resistor and a sixth resistor connected in series in the third circuit respectively, and R7 and R8 denote resistance values of a seventh resistor and an eighth resistor connected in series in the fourth circuit respectively.

In an embodiment, in the normal mode, controlling the switch module to be turned off so that the first circuit and the second circuit are both disconnected, includes: controlling the first switch unit to be turned off so that the first circuit is disconnected, and controlling the second switch unit to be turned off so that the second circuit is disconnected.

In an embodiment, in the detection mode, controlling the third circuit and the fourth circuit to be both turned on includes: controlling the third switch unit arranged in the third circuit and the fourth switch unit arranged in the fourth circuit both to be turned on.

In an embodiment, controlling the switch module to be turned off so that the third circuit and the fourth circuit are both controlled to be disconnected includes controlling the third switch unit and the fourth switch unit to be turned off.

In an embodiment, in the detection mode, controlling the third circuit and the fourth circuit to be turned on, controlling the switch module to be turned on so that at least one of the first circuit and the second circuit are turned on, and obtaining the resistance value of the first insulation impedance and the resistance value of the second insulation impedance, includes:

- controlling the switch module to be turned on so that both the first voltage-dividing circuit and the second voltage-dividing circuit are turned on;
- controlling the first switch component to connect the first branch circuit of the first circuit and the second branch circuit of the first circuit, and controlling the second switch component to connect the fourth branch circuit of the second circuit and the sixth branch circuit of the second circuit, performing a first detection operation, and obtaining a voltage Vp1 across the first voltage-dividing circuit and a voltage Vn1 across the second voltage-dividing circuit; and
- controlling the first switch component to connect the first branch circuit of the first circuit and the third branch circuit of the first circuit, controlling the second switch component to connect the fourth branch circuit of the second circuit and the fifth branch circuit of the second circuit, performing a second detection operation, and obtaining a voltage Vp2 across the first voltage-dividing circuit and a voltage Vn2 across the second voltage-dividing circuit.

In an embodiment, the control method for the power conversion system further includes calculating the resistance value of the first insulation impedance and the resistance value of the second insulation impedance according to:

$$\frac{(R1+R2) // (R5+R6) // Rx}{R4 // (R7+R8) // Ry} = \frac{Vp1}{Vn1}, \text{ and}$$

$$\frac{R1 // (R5+R6) // Rx}{(R3+R4) // (R7+R8) // Ry} = \frac{Vp2}{Vn2}$$

Where, Rx denotes the resistance value of the first insulation impedance, Ry denotes the resistance value of the second insulation impedance, and a sign // denotes a connection in parallel.

R1 denotes a resistance value of a first resistor in the first branch circuit of the first circuit, R2 denotes a resistance value of a second resistor in the second branch circuit of the first circuit, R3 denotes a resistance value of a third resistor in the fifth branch circuit of the second circuit, R4 denotes a resistance value of a fourth resistor in the fourth branch circuit of the second circuit, R5 and R6 denote resistance values of a fifth resistor and a sixth resistor respectively connected in series in the third circuit, and R7 and R8 denote resistance values of a seventh resistor and an eighth resistor respectively connected in series in the fourth circuit.

In an embodiment, in the normal mode, controlling the switch module to be turned off so that the first circuit and the second circuit are both disconnected, and controlling the switch module to be turned off so that the third circuit and the fourth circuit are both disconnected include controlling the switch module to be turned off so that the first voltage-dividing circuit and the second voltage-dividing circuit are disconnected.

In an embodiment, performing the first detection operation to obtain the voltage Vp1 across the first voltage-dividing circuit and the voltage Vn1 across the second voltage-dividing circuit includes: detecting a first voltage across a first terminal of a test resistor and a second terminal of the test resistor, the test resistor being a resistor arranged in the third circuit or in the fourth circuit; and obtaining the voltage Vp1 across the first voltage-dividing circuit and the voltage Vn1 across the second voltage-dividing circuit according to the first voltage.

In an embodiment, performing the second detection operation to obtain the voltage Vp2 across the first voltage-dividing circuit and the voltage Vn2 across the second voltage-dividing circuit includes: detecting a second voltage across a first terminal of a test resistor and a second terminal of the test resistor, where the test resistor is a resistor arranged in the third circuit or in the fourth circuit; and obtaining the voltage Vp2 across the first voltage-dividing circuit and the voltage Vn2 across the second voltage-dividing circuit 200 according to the second voltage.

For the power conversion system and the control method therefor disclosed in the disclosure, when the power conversion system performs an insulation impedance detection, the first voltage-dividing circuit and the second voltage-dividing circuit may be controlled to be turned on by the switch module, and voltage divisions of resistors in the first voltage-dividing circuit and/or in the second voltage-dividing circuit are detected and analyzed to obtain the insulation impedance to ground. When the insulation impedance detection is stopped, the switch module may be controlled to disconnect at least one of the first circuit, the second circuit, the third circuit and the fourth circuit, thereby reducing the resistors connected in parallel with the first insulation impedance and the second insulation impedance of the power conversion system, so as to reduce the decrease of the insulation impedance to ground caused by the resistance introduced by the insulation impedance detection, which is beneficial to ensuring that the power conversion system has a high insulation impedance to ground and beneficial to the normal operation of the power conversion system.

BRIEF DESCRIPTION OF THE DRAWINGS

In order to illustrate the technical solutions of the embodiments of the present disclosure and the prior art more clearly, the drawings needed for the description of the embodiments and the prior art are briefly described hereinafter. Obviously, the drawings described hereinafter are only some embodiments of the present disclosure. For the ordinary skilled in the art, other drawings may be obtained based on these drawings without creative work.

DETAILED DESCRIPTION OF THE EMBODIMENTS

Figure 1:
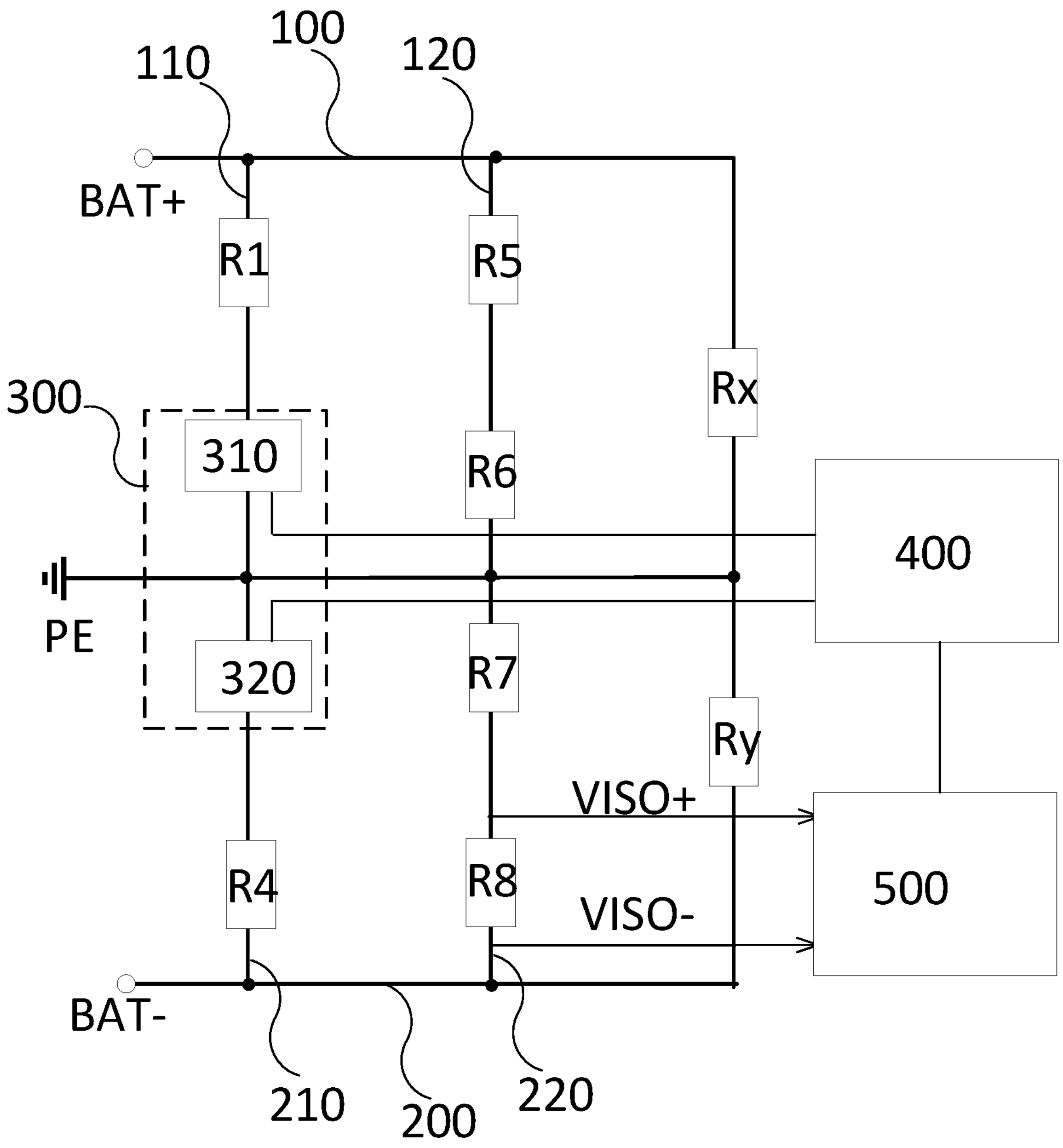
FIG. 1 is a schematic view of a power conversion system provided in an embodiment.

To facilitate understanding of the present disclosure, the present disclosure will be described in more detail hereinafter with reference to the relevant drawings. The preferred embodiments of the present disclosure are shown in the drawings. However, the present disclosure may be implemented in many different forms and is not limited to these embodiments described herein. On the contrary, the purpose of providing these embodiments is to make the contents of the present disclosure more thorough and comprehensive.

Unless otherwise defined, all technical and scientific terms used herein have the same meaning as those generally understood by the ordinary skilled in the art of the present disclosure. The terms used in the specification of the present disclosure herein are only for the purpose of describing specific embodiments and are not intended to limit the present disclosure.

At present, an insulation impedance detection circuit is usually arranged in a power conversion system, but the insulation impedance detection circuit may result in an additional impedance which may affect the overall insulation impedance to the ground of the power conversion system. In the related scheme, the insulation impedance detection circuit is implemented by using a fixed resistor connected in parallel with an insulation impedance to ground to divide an voltage, and the insulation impedance to ground is obtained by analyzing a voltage division value sampled by detecting. Alternatively, a bridge circuit detection method is used to obtain the insulation impedance to ground by sampling the voltage of the bridge circuit and analyzing the detected voltage of the bridge circuit. However, whether using a fixed resistor for voltage division or using a bridge circuit for detection, a resistor connected in parallel with the insulation impedance to ground will be introduced, and the resistance value of the introduced parallelly connected impedance is usually about 1 MΩ to 5 MΩ.

When an insulation detection is not required, the existing of the additional insulation test resistor in the insulation impedance detection circuit causes the overall insulation impedance of the power conversion system to decrease. An alarm threshold for a fault of the power conversion system is usually in the order of 1 MΩ. Since the additional resistance is introduced between the positive/negative electrode of the battery and the ground, the overall insulation impedance value of the power conversion system will be lowered. When the Battery Management System (BMS) performs an insulation detection, an insulation abnormality alarm may be triggered, thus affecting a normal operation of the power conversion system.

Figure 2:
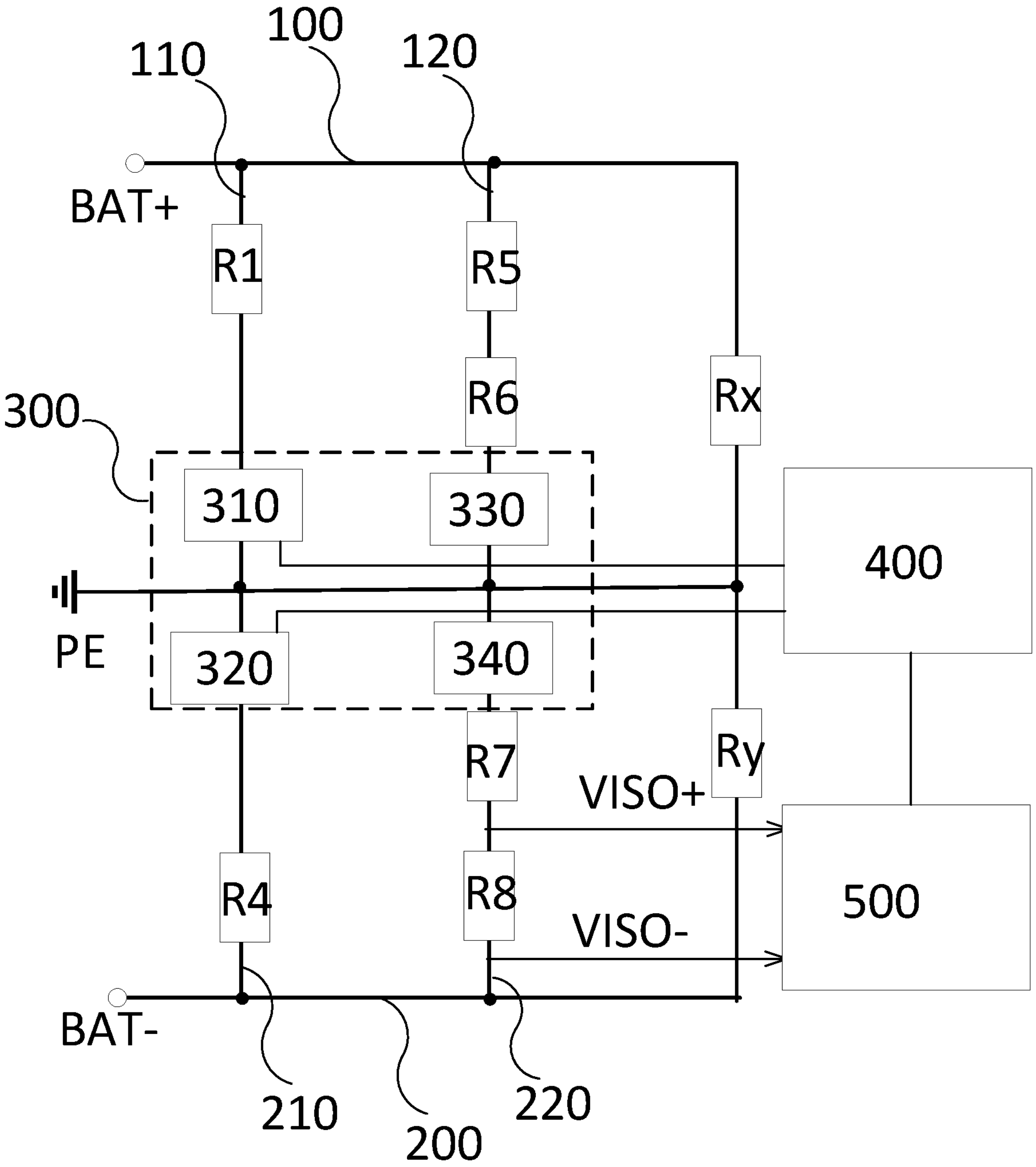
FIG. 2 is a schematic view of the power conversion system provided in another embodiment.
Figure 3:
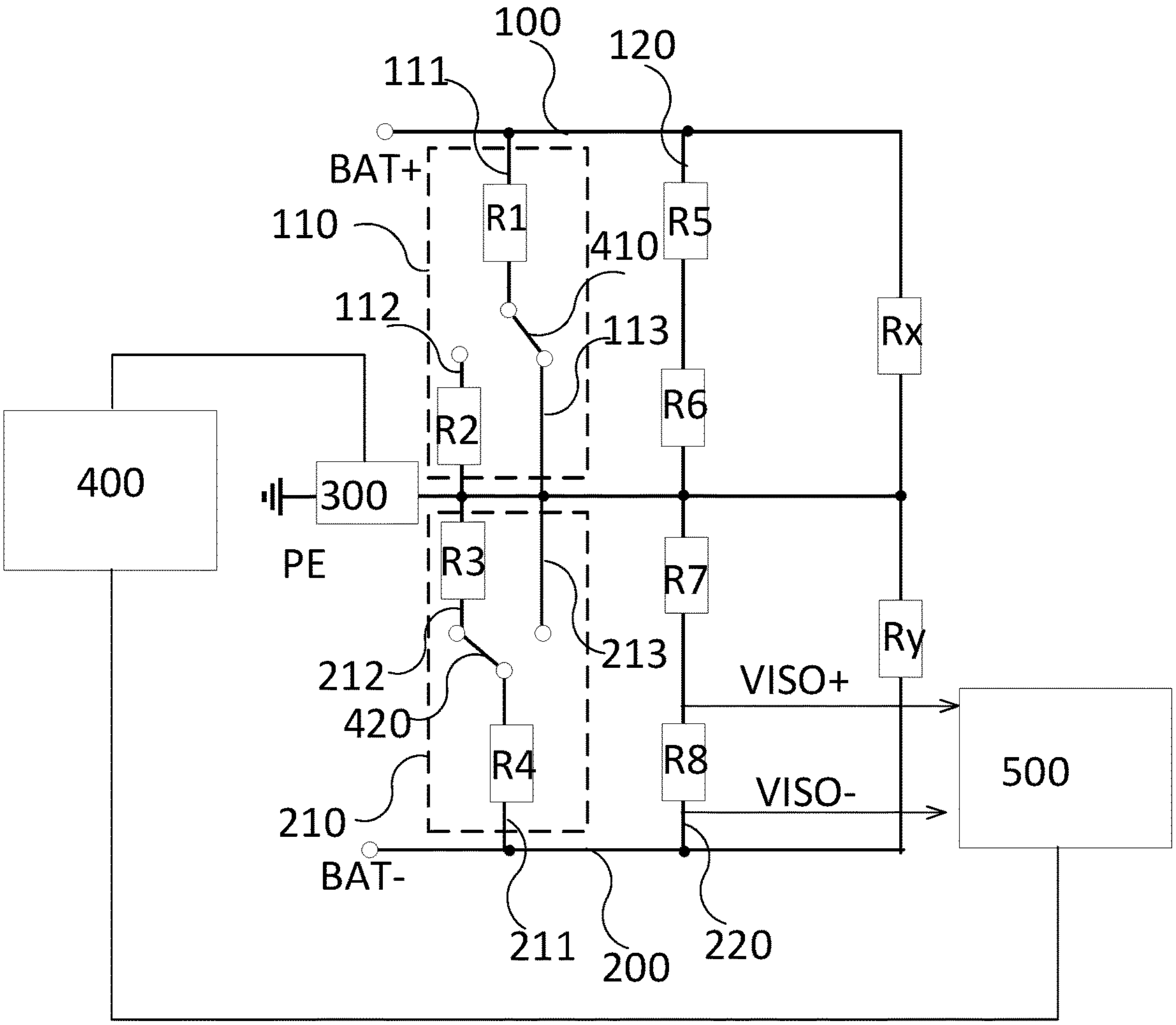
FIG. 3 is a schematic view of the power conversion system provided in yet another embodiment.

According to an exemplary embodiment, the present disclosure provides a power conversion system, as shown in FIG. 1, FIG. 2, or FIG. 3, the power conversion system includes: a first voltage-dividing circuit 100, a second voltage-dividing circuit 200, a switch module 300, a control module 400, and a detection module 500. The first voltage-dividing circuit 100 includes a first circuit 110, a third circuit 120, and a first insulation impedance Rx, which are connected in parallel between the positive electrode BAT+ of the power conversion system and the ground PE, and the first insulation impedance Rx is an insulation impedance of the positive electrode BAT+ to the ground of the power conversion system. The second voltage-dividing circuit 200 includes a second circuit 210, a fourth circuit 220, and a second insulation impedance Ry, which are connected in parallel between the ground PE and the negative electrode BAT− of the power conversion system. The output terminal of the first circuit 110 is connected to the input terminal of the second circuit 210, the output terminal of the third circuit 120 is connected to the input terminal of the fourth circuit 220, the output terminal of the first insulation impedance Rx is connected to the input terminal of the second insulation impedance Ry, and the second insulation impedance Ry is the insulation impedance of the negative electrode BAT- to ground of the power conversion system. The switch module 300 is arranged in the first voltage-dividing circuit 100 and/or in the second voltage-dividing circuit 200, and the conduction or disconnection of the first circuit 110 and/or the second circuit 210 is controlled by controlling the conduction or disconnection of the switch module 300, and/or the conduction or disconnection of the third circuit 120 and/or the fourth circuit 220 is controlled by controlling the conduction or disconnection of the switch module 300. The switch module 300 may include a device having the ability to disconnect and conduct. For example, the switch module 300 may include a single-pole double-throw switch, an optocoupler, an optocoupler transistor, a relay, etc., but is not limited thereto. The control module 400 is connected to the switch module 300, and the control module 400 is configured to control the conduction and disconnection of the switch module 300 to switch the working mode of the power conversion system to be the detection mode or the normal mode (the normal mode is a mode in which no insulation impedance detection is performed). The detection module 500 is connected to the first voltage-dividing circuit 100 or the second voltage-dividing circuit 200, and the detection module 500 is configured to detect the resistance values of the first insulation impedance Rx and the second insulation impedance Ry in the detection mode.

When the power conversion system performs an insulation impedance detection, the first voltage-dividing circuit 100 and the second voltage-dividing circuit 200 may be controlled to be turned on by the switch module 300, and voltage divisions of resistors in the first voltage-dividing circuit 100 and/or in the second voltage-dividing circuit 200 are detected and analyzed to obtain the insulation impedance to ground. When the insulation impedance detection is stopped, the switch module 300 may be controlled by the control module 400 to disconnect at least one of the first circuit 110, the second circuit 210, the third circuit 120 and the fourth circuit 220, thereby reducing the resistors connected in parallel with the first insulation impedance Rx and the second insulation impedance Ry of the power conversion system, so as to reduce the decrease of the insulation impedance to ground caused by the insulation impedance detection resistance introduced by the first voltage-dividing circuit 100 and the second voltage-dividing circuit 200, which is beneficial to ensuring that the power conversion system has a high insulation impedance to ground and beneficial to the normal operation of the power conversion system.

In some embodiments, referring to FIG. 1 and FIG. 2, the switch module 300 includes a first switch unit 310 and a second switch unit 320.

The first switch unit 310 is arranged in the first circuit 110 and configured to control the first circuit 110 to be turned on or off. The first switch unit 310 may be a single-pole double-throw switch, a photocoupler, an optocoupler transistor, a relay, etc., but is not limited thereto.

The second switch unit 320 is arranged in the second circuit 210 and configured to control the second circuit 210 to be turned on or off. The second switch unit 320 may be a single-pole double-throw switch, a photocoupler, a photocoupler transistor, a relay, etc., but is not limited thereto.

The control module 400 is connected to and configured to control the first switch unit 310, the second switch unit 320, and the detection module 500 respectively.

In the detection mode, the control module 400 is configured to control the first switch unit 310 to be turned on, control the second switch unit 320 to be turned off, and control the detection module 500 to perform a first detection operation, to obtain the voltage Vp1 across the first voltage-dividing circuit 100 and the voltage Vn1 across the second voltage-dividing circuit 200.

The control module 400 is further configured to control the first switch unit 310 to be turned off, control the second switch unit 320 to be turned on, and control the detection module 500 to perform a second detection operation to obtain the voltage Vp2 across the first voltage-dividing circuit 100 and the voltage Vn2 across the second voltage-dividing circuit 200. The control module 400 controls the first switch unit 310 to be turned off and the second switch unit 320 to be turned on, and the resistance of the first voltage-dividing circuit 100 and the resistance of the second voltage-dividing circuit 200 change, so that the voltage divisions of the first voltage-dividing circuit 100 and the second voltage-dividing circuit 200 change.

The detection module 500 is further configured to calculate the resistance values of the first insulation impedance Rx and the second insulation impedance Ry respectively according to following Equations:

$$\frac{R1 // (R5 + R6) // Rx}{(R7 + R8) // Ry} = \frac{Vp1}{Vn1}$$

$$\frac{(R5 + R6) // Rx}{R4 // (R7 + R8) // Ry} = \frac{Vp2}{Vn2}$$

Where, Rx denotes the resistance value of the first insulation impedance, and Ry denotes the resistance value of the second insulation impedance. In the present disclosure, a sign // denotes a connection in parallel. For example, R4//(R7+R8)//Ry denotes a total resistance value of the second voltage-dividing circuit 200 formed by the second circuit with a resistance value R4, the fourth circuit with a resistance value (R7+R8), and the second insulation impedance with a resistance value Ry connected in parallel as shown in FIG. 2.

R1 denotes the resistance value of a first resistor R1 of the first circuit, R4 denotes the resistance value of a fourth resistor R4 of the second circuit, R5 and R6 denote the resistance values of a fifth resistor R5 and a sixth resistor R6 connected in series in the third circuit respectively, and R7 and R8 denote the resistance values of a seventh resistor R7 and an eighth resistor R8 connected in series in the fourth circuit.

In a normal mode, the control module 400 controls the first switch unit 310 and the second switch unit 320 to be disconnected.

In this way, when the insulation impedance detection is stopped, the first circuit 110 may be controlled to be disconnected by the first switch unit 310, and the second circuit 210 may be controlled to be disconnected by the second switch unit 320, thus disconnecting the circuits connected in parallel with the first insulation impedance Rx and the second insulation impedance Ry respectively, so as to reduce the resistance connected in parallel with the first insulation impedance Rx and the second insulation impedance Ry, and reduce the decrease of the insulation impedance to ground caused by the insulation impedance detection resistance introduced by the insulation impedance detection, which is beneficial to ensuring that the power conversion system has a comparatively high insulation impedance to ground and beneficial to the normal operation of the power conversion system.

In some embodiments, referring to FIG. 1 and FIG. 2, the first circuit 110 includes the first resistor R1, the first terminal of the first resistor R1 is connected to the positive electrode BAT+ of the power conversion system, the second terminal of the first resistor R1 is connected to the ground PE. The third circuit 120 includes a fifth resistor R5 and a sixth resistor R6 connected in series, the first terminal of the fifth resistor R5 is connected to the positive electrode BAT+ of the power conversion system, the second terminal of the fifth resistor R5 is connected to the first terminal of the resistor R6, and the second terminal of the sixth resistor R6 is connected to the ground PE. The second circuit 210 includes the fourth resistor R4, the first terminal of the fourth resistor R4 is connected to the ground PE, and the second terminal of the fourth resistor R4 is connected to the negative electrode BAT− of the power conversion system. The fourth circuit 220 includes the seventh resistor R7 and the eighth resistor R8 connected in series, the first terminal of the seventh resistor R7 is connected to the ground PE, the second terminal of the seventh resistor R7 is connected to the first terminal of the eighth resistor R8, and the second terminal of the eighth resistor R8 is connected to the negative electrode BAT− of the power conversion system. The resistance values of the first resistor R1 to the eighth resistor R8 are all known.

It may be understood that this embodiment only illustrates the power conversion system, and the number and resistance values of the resistors arranged in each specific circuit may be flexibly adjusted according to detection requirements.

It may be understood that any switch device capable of performing switching of circuits is within the protection scope of the present disclosure.

In some embodiments, the first switch unit 310 and the second switch unit 320 both perform switching of circuits by using single-pole double-throw switches, which has a low cost, a simple structure, and better effects.

In other implementable embodiments, the first switch unit 310 and the second switch unit 320 may be N-type metal oxide semiconductor (NMOS) transistors or P-type metal oxide semiconductor (PMOS) transistors, or other controllable switch devices.

In some embodiments, referring to FIG. 2, the switch module 300 further includes a third switch unit 330 and a fourth switch unit 340.

The third switch unit 330 is arranged in the third circuit 120 and configured to control the conduction or disconnection of the third circuit 120. The third switch unit 330 may be a single-pole double-throw switch, a photocoupler, an optocoupler transistor, a relay, etc., but is not limited thereto.

The fourth switch unit 340 is arranged in the fourth circuit 220 and configured to control the conduction or disconnection of the fourth circuit 220. The fourth switch unit 340 may be a single-pole double-throw switch, a photocoupler, an optocoupler transistor, a relay, etc., but is not limited thereto.

The control module 400 is connected to and configured to control the third switch unit 330 and the fourth switch unit 340 respectively.

In the detection mode, the control module 400 is configured to control the third switch unit 330 and the fourth switch unit 340 to be turned on.

In the normal mode, the control module 400 controls the third switch unit 330 and the fourth switch unit 440 to be turned off.

In this way, the first circuit 110, the second circuit 210, the third circuit 120, and the fourth circuit 220 may be controlled to be turned on or off by the first switch unit 310, the second switch unit 320, the third switch unit 330, and the fourth switch unit 340, respectively. When the insulation impedance detection is stopped, the first circuit 110, the second circuit 210, the third circuit 120, and the fourth circuit 220 may be controlled to be disconnected by the control module 400 to prevent the resistance introduced by the insulation detection from causing the overall insulation impedance to ground of the power conversion system to be reduced, which is beneficial to ensuring that the power conversion system has a high insulation impedance to ground and beneficial to the normal operation of the power conversion system. What's more, the first circuit 110, the second circuit 210, the third circuit 120, and the fourth circuit 220 are all disconnected, which may avoid a too large switching range of the resistance of the first voltage-dividing circuit 100 and the second voltage-dividing circuit 200 when the first circuit 110 and the second circuit 210 are completely disconnected, which is beneficial to ensuring the detection accuracy of the power conversion system.

In some embodiments, referring to FIG. 3, one terminal of the switch module 300 is connected to the ground PE, and the other terminal of the switch module 300 is connected to the output terminal of the first voltage-dividing circuit 100 and the input terminal of the second voltage-dividing circuit 200.

In the detection mode, the control module 400 is configured to control the switch module 300 to be turned on, so that both the first voltage-dividing circuit 100 and the second voltage-dividing circuit 200 are turned on.

In the normal mode, the control module 400 controls the switch module 300 to be turned off, so that both the first voltage-dividing circuit 100 and the second voltage-dividing circuit 200 are disconnected.

In this way, it is only necessary to arrange a switch module 300 at a terminal where the first voltage-dividing circuit 100, the second voltage-dividing circuit 200 and the ground PE are connected. To simultaneously control the conduction or disconnection of the first circuit 110, of the second circuit 210, of the third circuit 120 and of the fourth circuit 220, the control module 400 only needs to control the switch module 300. The structure of the power conversion system is simpler, and the control method is simple. When the insulation impedance detection is stopped, the control module 400 may control the switch module 300 to simultaneously disconnect the first circuit 110, the second circuit 210, the third circuit 120 and the fourth circuit 220, thus preventing the resistance of the first circuit 110, the resistance of the second circuit 210, the resistance of the third circuit 120 and the resistance of the fourth circuit 220 from affecting the overall insulation impedance to ground of the power conversion system, which is beneficial to ensuring that the power conversion system has high insulation impedance to ground and beneficial to the normal operation of the power conversion system.

In some embodiments, referring to FIG. 3, the first circuit 110 includes a first branch circuit 111, a second branch circuit 112, a third branch circuit 113 and a first switch component 410. The first branch circuit 111 is connected to the positive electrode BAT+ of the power conversion system, the second branch circuit 112 and the third branch circuit 113 are connected to the ground PE. The second branch circuit 112 and the third branch circuit 113 have different resistance values, and the first switch component 410 is configured to control the first branch circuit 111 to be connected to the second branch circuit 112 or to be connected to the third branch circuit 113 to adjust the total resistance of the first circuit 110. The first switch component 410 may be a single-pole single-throw switch, an optocoupler, an optocoupler transistor, a relay, etc., but is not limited thereto.

The first branch circuit 111 of the first circuit 110 may be connected to the second branch circuit 112 or the third branch circuit 113 through the first switch component 410, so as to adjust the resistance of the first circuit 110. In an example, the second branch circuit 112 and the third branch circuit 113 are both provided with resistors, and the resistance values of the second branch circuit 112 and the third branch circuit 113 are different. In another example, one of the second branch circuit 112 and the third branch circuit 113 is provided with a resistor, and the other of the second branch circuit 112 and the third branch circuit 113 is not provided with a resistor but an electrical wire.

The second circuit 210 includes a fourth branch circuit 211, a fifth branch circuit 212, a sixth branch circuit 213 and a second switch component 420. The fourth branch circuit 211 is connected to the negative electrode BAT− of the power conversion system, and the fifth branch circuit 212 and the sixth branch circuit 213 are connected to the ground PE. The second switch component 420 is connected to the second terminal of the fourth branch circuit 211, and the fifth branch circuit 212 and the sixth branch circuit 213 have different resistance values. The second switch component 420 controls the fourth branch circuit 211 to be connected to the fifth branch circuit 212 or the sixth branch circuit 213, to adjust the total resistance of the second circuit 210. The second switch component 420 may be a single-pole single-throw switch, a photocoupler, an optocoupler transistor, a relay, etc., but is not limited thereto.

The fourth branch circuit 211 of the second circuit 210 may be connected to the fifth branch circuit 212 or the sixth branch circuit 213 by the second switch component 420, thus adjusting the resistance of the second circuit 210. In an example, both the fifth branch circuit 212 and the sixth branch circuit 213 are provided with a resistor, and the resistance values of resistors in the fifth branch circuit 212 and the sixth branch circuit 213 are different. In another example, one of the fifth branch circuit 212 and the sixth branch circuit 213 is provided with a resistor, and the other of the fifth branch circuit 212 and the sixth branch circuit 213 is not provided with a resistor but an electrical wire.

For example, the first branch circuit 111 of the first circuit 110 is provided with the first resistor R1, the second branch circuit 112 is provided with the second resistor R2, and no resistor is arranged in the third branch circuit 113. The third circuit 120 includes the fifth resistor R5 and the sixth resistor R6 connected in series, the first terminal of the fifth resistor R5 is connected to the positive electrode BAT+ of the power conversion system, the second terminal of the fifth resistor R5 is connected to the first terminal of the sixth resistor R6, and the second terminal of the sixth resistor R6 is connected to the ground PE.

The fourth branch circuit 211 of the second circuit 210 is provided with the fourth resistor R4, the fifth branch circuit 212 is provided with the third resistor R3, and no resistor is provided in the sixth branch circuit 213. The fourth circuit 220 includes the seventh resistor R7 and the eighth resistor R8 connected in series, the first terminal of the seventh resistor R7 is connected to the ground PE, the second terminal of the seventh resistor R7 is connected to the first terminal of the eighth resistor R8, and the second terminal of the eighth resistor R8 is connected to the negative electrode BAT− of the power conversion system. The resistance values of the first resistor R1 to the eighth resistor R8 are all known. The test resistor is any one of the sixth resistor R6 to the eighth resistor R8.

In some embodiments, the control module 400 is connected to and configured to control the first switch component 410, the second switch component 420, and the detection module 500.

In the detection mode, the control module 400 is configured to control the first switch unit 410 to connect the first branch circuit 111 of the first circuit 110 and the second branch circuit 112 of the first circuit 110, and configured to control the second switch unit 420 to connect the fourth branch circuit 211 of the second circuit 210 and the sixth branch circuit 213 of the second circuit 210, and configured to control the detection module 500 to perform the first detection operation to obtain the voltage Vp1 across the first voltage-dividing circuit and the voltage Vn1 across the second voltage-dividing circuit.

The control module 400 is further configured to control the first switch unit 410 to connect the first branch circuit 111 of the first circuit 110 and the third branch circuit 113 of the first circuit 110, and configured to control the second switch unit 420 to connect the fourth branch circuit 211 of the second circuit 210 and the fifth branch circuit 212 of the second circuit 210, and configured to control the detection module 500 to perform a second detection operation to obtain the voltage Vp2 across the first voltage-dividing circuit and the voltage Vn2 across the second voltage-dividing circuit.

The detection module 500 is further configured to calculate the resistance values of the first insulation impedance and the second insulation impedance according to following equations:

$$\frac{(R1+R2)\,//\,(R5+R6)\,//\,Rx}{R4\,//\,(R7+R8)\,//\,Ry}=\frac{Vp1}{Vn1}$$

-continued $$\frac{R1\,//\,(R5+R6)\,//\,Rx}{(R3+R4)\,//\,(R7+R8)\,//\,Ry}=\frac{Vp2}{Vn2}$$

Where, Rx denotes the resistance value of the first insulation impedance, and Ry denotes the resistance value of the second insulation impedance.

R1 denotes the resistance value of the first resistor R1 of the first branch circuit 111 of the first circuit 110, R2 denotes the resistance value of the second resistor R2 of the second branch circuit 112 of the first circuit 110, R3 denotes the resistance value of the third resistor R3 of the fifth branch circuit 212 of the second circuit 210, R4 denotes the resistance value of the fourth resistor R4 of the fourth branch circuit 211 of the second circuit 210, R5 and R6 denote the respective resistance values of the fifth resistor R5 and the sixth resistor R6 connected in series in the third circuit 120, and R7 and R8 denote the respective resistance values of the seventh resistor R7 and the eighth resistor R8 connected in series in the fourth circuit 220.

When the power conversion system of this embodiment is in the normal mode, the switch module 300 is controlled to be turned off to disconnect the first circuit 110, the second circuit 210, the third circuit 120 and the fourth circuit 220, so as to prevent the parallelly connected resistors introduced by the first voltage-dividing circuit 100 and the second voltage-dividing circuit 200 from affecting the overall insulation impedance to ground of the power conversion system, which is beneficial to ensuring that the power conversion system has high insulation impedance to ground and beneficial to the normal operation of the power conversion system.

In some embodiments, the detection module 500 and a test resistor are connected in parallel, that is, the detection module 500 is connected to the first and second terminals of the test resistor, and the test resistor may be any resistor in the third circuit 120 or in the fourth circuit 220. For example, the test resistor may be any one of the fifth resistor R5, the sixth resistor R6, the seventh resistor R7 and the eighth resistor R8.

When the detection module 500 performs the first detection operation, the detection module 500 detects a first voltage across the test resistor, and calculates the voltage Vp1 across the first voltage-dividing circuit 100 and the voltage Vn1 across the second voltage-dividing circuit 200 according to the first voltage.

When the detection module 500 performs the second detection operation, the detection module 500 detects a second voltage of the test resistor, and calculates the voltage Vp2 across the first voltage-dividing circuit 100 and the voltage Vn2 across the second voltage-dividing circuit 200 according to the second voltage.

It may be understood that the voltage across the positive electrode BAT+ of the power conversion system and the negative electrode BAT− of the power conversion system is Vbat, and Vbat=Vp+Vn, where Vp denotes the voltage across the first voltage-dividing circuit 100, Vn denotes the voltage across the second voltage-dividing circuit 200. Therefore, the voltage across two terminals of any resistor in the third circuit 120 or the fourth circuit 220 is detected to obtain the voltage division of the test resistor, and the voltage across the third circuit 120 or the fourth circuit 220 where the test resistor is located may be calculated according to the voltage division of the resistor. Since circuits in the first voltage-dividing circuit 100 are connected in parallel, and the circuits in the second voltage-dividing circuit 200 are connected in parallel, the voltage across the third circuit 120 is the voltage Vp across the first voltage-dividing circuit 100, and the voltage across the fourth circuit 220 is the voltage Vn across the second voltage-dividing circuit 200. The voltage Vbat is known, and the voltage Vn across the second voltage-dividing circuit 200 or the voltage Vp across the first voltage-dividing circuit 100 may be further calculated.

In some embodiments, the power conversion system further includes a clock unit (not shown in the figures), which is connected to the control module 400 and the detection module 500. The clock unit is configured to adjust clocks of the control module 400 and the detection module 500 to be the same, so that the detection module 500 performs the first detection operation and the second detection operation according to a control time sequence of the control module 400.

Figure 4:
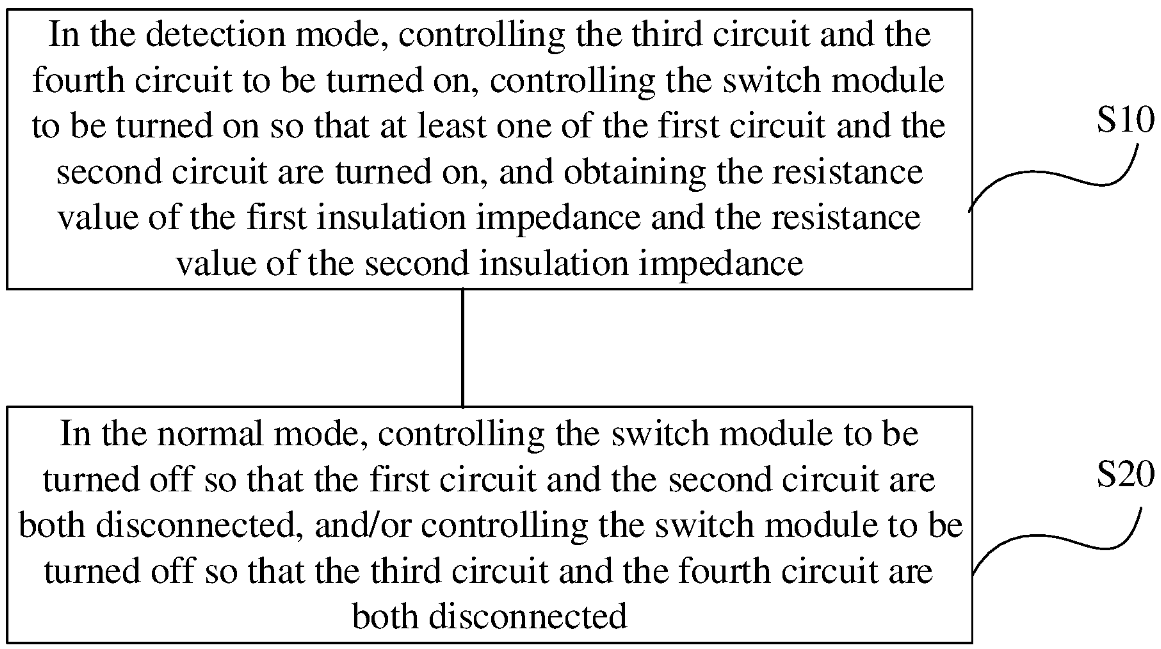
FIG. 4 is a flow chart of a control method for a power conversion system provided in an embodiment.

According to an exemplary embodiment, this embodiment provides a control method for a power conversion system, which is described by taking the method applied to a terminal as an example. As shown in FIG. 4, the working mode of the power conversion system includes a detection mode and a normal mode, and the control method for the power conversion system includes Step S10 and Step S20.

At Step S10, in the detection mode, the third circuit 120 and the fourth circuit 220 are both controlled to be turned on, and the switch module 300 is controlled to be turned on, so that at least one of the first circuit 110 and the second circuit 210 are turned on, thus obtaining the resistance values of the first insulation impedance Rx and the second insulation impedance Ry.

At Step S20, in the normal mode, the switch module 300 is controlled to be turned off, so that the first circuit 110 and the second circuit 210 are both disconnected, and/or the switch module 300 is controlled to be turned off, so that the third circuit 120 and the fourth circuit 220 are both disconnected.

When the terminal is in the detection mode, the terminal controls the third circuit 120 and the fourth circuit 220 of the power conversion system to be turned on, and controls at least one of the first circuit 110 and the second circuit 210 to be turned on by controlling the switch module 300, thereby controlling the resistance change of the first circuit 110 and the second circuit 210, and the resistance change of the first voltage-dividing circuit 100 and the second voltage-dividing circuit 200, so that the voltage across the first voltage-dividing circuit 100 and the voltage across the second voltage-dividing circuit 200 change. The resistance values of the first insulation impedance Rx and the second insulation impedance Ry are obtained by analysis and calculation based on the voltage across the first voltage-dividing circuit 100 and the voltage across the second voltage-dividing circuit 200, and the resistance values of the first circuit 110, the second circuit 210, the third circuit 120 and the fourth circuit 220. The specific detection mechanism is described in detail in the subsequent embodiments.

When the terminal is in the normal mode, the switch module 300 is controlled to be turned off, so that the first circuit 110 and the second circuit 210 are disconnected, or so that the first circuit 110, the second circuit 210, the third circuit 120 and the fourth circuit 220 are all disconnected, thus reducing the resistors connected in parallel with the first insulation impedance Rx and the second insulation impedance Ry of the power conversion system respectively, and reducing the decrease of the insulation impedance to ground caused by the resistance introduced by the insulation impedance detection, which is beneficial to ensuring that the power conversion system has a high insulation impedance to ground and beneficial to the normal operation of the power conversion system.

In some embodiments, Step S10 of controlling, in the detection mode, the third circuit 120 and the fourth circuit 220 to be turned on, and controlling the switch module 300 to be turned on, so that at least one of the first circuit 110 and the second circuit 210 is turned on, to obtain the resistance values of the first insulation impedance Rx and the second insulation impedance Ry includes Step S101 and S102.

In Step S101, the first switch unit 310 arranged in the first circuit 110 is controlled to be turned on so that the first circuit 110 is turned on, and the second switch unit 320 arranged in the second circuit 210 is controlled to be turned off so that the second circuit 210 is disconnected, and a first detection operation is performed to obtain a voltage Vp1 across the first voltage-dividing circuit and a voltage Vn1 across the second voltage-dividing circuit.

Further, the step S101 of performing the first detection operation to obtain the voltage Vp1 across the first voltage-dividing circuit and the voltage Vn1 across the second voltage-dividing circuit includes step S101-1 and step S101-2.

In Step S101-1, a first voltage across a first terminal of a test resistor and a second terminal of the test resistor is detected, where the test resistor is a resistor arranged in the third circuit 120 or in the fourth circuit 220.

In Step S101-2, the voltage Vp1 across the first voltage-dividing circuit 100 and the voltage Vn1 across the second voltage-dividing circuit 200 are obtained according to the first voltage.

Referring to FIG. 1, the terminal controls the third circuit 120 and the fourth circuit 220 to be turned on, which may be realized by controlling the switch module 300 to control the third circuit 120 and the fourth circuit 220 to be turned on, or by directly controlling the third circuit 120 and the fourth circuit 220 to keep turned on all the time.

The terminal controls the first switch unit 310 to be turned on so that the first circuit 110 is turned on, and controls the second switch unit 320 to be turned off so that the second circuit 210 is disconnected. In this state, the third circuit 120 of the first voltage-dividing circuit 100 is connected in parallel with the first insulation detection impedance, and the second circuit 210 and the fourth circuit 220 in the second voltage-dividing circuit 200 both are connected in parallel with the second insulation impedance Ry. The electric potential $VISO_+$ at the first terminal of the test resistor and the electric potential $VISO\_$ at the second terminal of the test resistor are detected, to obtain a first voltage VPP1, $VPP1=VISO_+-VISO_-$.

For example, the first circuit 110 has the first resistor R1, the second circuit 210 has the fourth resistor R4, the third circuit 120 has the fifth resistor R5 and the sixth resistor R6 connected in series, the fourth circuit 220 has at the seventh resistor R7 and the eighth resistor R8 connected in series, and the test resistor is any one of the sixth resistor R6 to the eighth R8. Resistance values of the first resistor R1 to the eighth R8 are all known.

For example, the resistor R8 is the test resistor, the electric potential $VISO_+$ at the first terminal of the eighth resistor R8 and the electric potential VISO− at the second terminal of the eighth resistor R8 are detected to obtain the first voltage VPP1 across the eighth resistor R8. The voltage across the fourth circuit 220 is calculated based on the first voltage, and the voltage across the fourth circuit 220 is the voltage Vn1 across the second voltage-dividing circuit 200 in this state.

The voltage across the positive electrode BAT+ of the power conversion system and the negative electrode BAT− of the power conversion system is Vbat, where Vp1=Vbat−Vn1, and the voltage Vp1 across the first voltage-dividing circuit 100 in this state is obtained by calculation.

In Step S102, the first switch unit 310 is controlled to be turned off so that the first circuit 110 is turned off, and the second switch unit 320 is controlled to be turned on so that the second circuit 210 is turned on, and a second detection operation is performed to obtain a voltage Vp2 across the first voltage-dividing circuit and a voltage Vn2 across the second voltage-dividing circuit.

Further, the second detection operation is performed to obtain the voltage Vp2 across the first voltage-dividing circuit and the voltage Vn2 across the second voltage-dividing circuit includes Step S102-1 and Step S102-2.

In Step S102-1, a second voltage across a first terminal of a test resistor and a second terminal of the test resistor is detected, where the test resistor is a resistor arranged in the third circuit 120 or in the fourth circuit 220.

In Step S102-2, the voltage Vp2 across the first voltage-dividing circuit 100 and the voltage Vn2 across the second voltage-dividing circuit 200 are obtained according to the second voltage.

Referring to FIG. 1, the terminal controls the first switch unit 310 to be turned off so that the first circuit 110 is disconnected, and controls the second switch unit 320 to be turned on so that the second circuit 210 is turned on. In this state, the third circuit 120 in the first voltage-dividing circuit 100 is connected in parallel with the first insulation detection impedance, and the second circuit 210 and the fourth circuit 220 in the second voltage-dividing circuit 200 are connected in parallel with the second insulation impedance Ry. The voltage Vp2 across the first voltage-dividing circuit 100 and the voltage Vn2 across the second voltage-dividing circuit 200 change.

The electric potential $VISO_+$ at the first terminal of the test resistor and the electric potential VISO_ at the second terminal of the test resistor are detected, to obtain a second voltage VPP2, $VPP2=VISO_+-VISO\_$.

Similarly, the eighth resistor R8 is the test resistor, and the second voltage VPP2 across the eighth resistor R8 is detected, and the voltage Vn2 across the second voltage-dividing circuit 200 in this state is calculated. The voltage Vp2 across the first voltage-dividing circuit 100 in this state is calculated as Vp2=Vbat−Vn2.

In this embodiment, the resistance values of the first insulation impedance Rx and the second insulation impedance Ry are calculated according to following Equations:

$$\frac{R1 // (R5+R6) // Rx}{(R7+R8) // Ry} = \frac{Vp1}{Vn1}$$

$$\frac{(R5+R6) // Rx}{R4 // (R7+R8) // Ry} = \frac{Vp2}{Vn2}$$

Where, Rx denotes the first insulation impedance Rx, and Ry denotes the second insulation impedance Ry.

R1 denotes the resistance value of the first resistor R1 of the first circuit 110, R4 denotes the resistance value of the fourth resistor R4 of the second circuit 210, R5 and R6 denote the resistance values of the fifth resistor R5 and the sixth resistor R6 connected in series in the third circuit 120 respectively, and R7 and R8 denote the resistance values of the seventh resistor R7 and the eighth resistor R8 connected in series in the fourth circuit 220 respectively.

In some embodiments, referring to FIG. 1, in the normal mode, controlling the switch module 300 to be turned off so that both the first circuit 110 and the second circuit 210 are disconnected, includes: controlling the first switch unit 310 to be turned off so that the first circuit 110 is disconnected, and controlling the second switch unit 320 to be turned off so that the second circuit 210 is disconnected.

In this way, the resistors connected in parallel with the first insulation impedance Rx and the second insulation impedance Ry of the power conversion system are reduced, thus reducing the decrease of the insulation impedance to ground caused by the insulation impedance detection resistance introduced by the power conversion system, which is beneficial to ensuring that the power conversion system has a high insulation impedance to ground and beneficial to the normal operation of the power conversion system.

In some embodiments, in the detection mode, controlling the third circuit 120 and the fourth circuit 220 to be both turned on includes: controlling the third switch unit 330 arranged in the third circuit 120 and the fourth switch unit 340 arranged in the fourth circuit 220 both to be turned on.

Controlling the third circuit 120 and the fourth circuit 220 both to be disconnected by controlling the switch module 300 to be turned off includes controlling the third switch unit 330 and the fourth switch unit 340 to be turned off.

Referring to FIG. 2, in the detection mode, firstly, the terminal controls the third switch unit 330 and the fourth switch unit 340 to be turned on so that the third circuit 120 and the fourth circuit 220 are turned on, and then the terminal controls the first switch unit 310 and the second switch unit 320 to be turned on and off to perform the above steps S101 and S102 respectively, to detect the insulation impedance.

Referring to FIG. 2, in the normal mode, the first switch unit 310, the second switch unit 320, the third switch unit 330, and the fourth switch unit 340 are all controlled to be turned off, thus preventing the resistors in the first circuit 110, in the second circuit 210, in the third circuit 120, and in the fourth circuit 220 from affecting the overall insulation impedance to ground of the power conversion system, which is beneficial to ensuring that the power conversion system has high insulation impedance to ground and beneficial to the normal operation of the power conversion system.

In some embodiments, Step S10 of controlling, in the detection mode, the third circuit 120 and the fourth circuit 220 to be turned on, and controlling the switch module 300 to be turned on, so that at least one of the first circuit 110 and the second circuit 210 to be turned on, to obtain the resistance values of the first insulation impedance Rx and the second insulation impedance Ry includes Step S103, Step 104 and Step S105.

In Step S103, the switch module 300 is controlled to be turned on so that both the first voltage-dividing circuit 100 and the second voltage-dividing circuit 200 are turned on.

In Step S104, the first switch component 410 is controlled to connect the first branch circuit 111 of the first circuit 110 and the second branch circuit 112 of the first circuit 110, and the second switch component 420 is controlled to connect the fourth branch circuit 211 in the second circuit 210 and the sixth branch circuit 213 in the second circuit 210, and a first voltage across a first terminal of the test resistor and a second terminal of the test resistor is detected. The test resistor is a resistor arranged in the third circuit 120 or in the fourth circuit 220, and a voltage Vp1 across the first voltage-dividing circuit 100 and a voltage Vn1 across the second voltage-dividing circuit 200 are obtained according to the first voltage.

Further, the step S101 of performing the first detection operation to obtain the voltage Vp1 across the first voltage-dividing circuit and the voltage Vn1 across the second voltage-dividing circuit includes step S104-1 and step S104-2.

In Step S104-1, a first voltage across a first terminal of the test resistor and a second terminal of the test resistor is detected, where the test resistor is a resistor arranged in the third circuit 120 or in the fourth circuit 220.

Step S104-2, the voltage Vp1 across the first voltage-dividing circuit 100 and the voltage Vn1 across the second voltage-dividing circuit 200 are obtained according to the first voltage.

Referring to FIG. 3, the terminal controls the switch module 300 to be turned on, so that both the first voltage-dividing circuit 100 and the second voltage-dividing circuit 200 are turned on. The terminal controls the first switch component 410 to be connected to the second branch circuit 112, and controls the first branch circuit 111 of the first circuit 110 to be connected to the second branch circuit 112 of the first circuit 110.

Exemplarily, the first branch circuit 111 has the first resistor R1, the second branch circuit 112 has the second resistor R2, and the resistance of the first circuit 110 is R1+R2. The terminal controls the second switch component 420 to be connected to the sixth branch circuit 213, thus the fourth branch circuit 211 of the second circuit 210 is connected to the sixth branch circuit 213. The fourth branch circuit 211 has the fourth resistor R4, no resistor is arranged in the sixth branch circuit 213, and the resistance of the second circuit 210 is R4.

The third circuit 120 has the fifth resistor R5 and the sixth resistor R6 connected in series, and the fourth circuit 220 has the seventh resistor R7 and the eighth resistor R8 connected in series. Resistance values of the first resistor R1 to the eighth resistor R8 all are known.

Any one of the sixth resistor R6 to the eighth resistor R8 may be used as the test resistor. Taking the eighth resistor R8 being the test resistor as an example for explanation. The electric potential $VISO_+$ at the first terminal of the resistor R8 and the electric potential VISO_ at the second terminal of the eighth resistor R8 are detected, to obtain a first voltage VPP1 across the eighth resistor R8. The voltage across the fourth circuit 220 is calculated based on the eighth resistor R8 and the first voltage, and the voltage across the fourth circuit 220 is the voltage Vn1 across the second voltage-dividing circuit 200 in this state. The voltage Vp1 across the first voltage-dividing circuit 100 in this state is calculated as Vp1=Vbat−Vn1.

In Step S105, the first switch component 410 is controlled to connect the first branch circuit 111 of the first circuit 110 and the third branch circuit 113 of the first circuit 110, and the second switch component 420 is controlled to connect the fourth branch circuit 211 of the second circuit 210 and the fifth branch circuit 212 of the second circuit 210, and a second detection operation is performed to obtain the voltage Vp2 across the first voltage-dividing circuit 100 and the voltage Vn2 across the second voltage-dividing circuit 200.

Further, performing a second detection operation to obtain the voltage Vp2 across the first voltage-dividing circuit and the voltage Vn2 across the second voltage-dividing circuit includes Step S105-1 and Step S105-2.

In Step S105-1, a second voltage across a first terminal and a second terminal of the test resistor is detected, where the test resistor is a resistor arranged in the third circuit 120 or in the fourth circuit 220.

In Step S105-2, the voltage Vp1 across the first voltage-dividing circuit 100 and the voltage Vn1 across the second voltage-dividing circuit 200 may be obtained according to the second voltage.

Referring to FIG. 3, the terminal controls the first switch component 410 to connect the third branch circuit 113 instead of connecting the second branch circuit 112, and the first branch circuit 111 of the first circuit 110 is connected to the third branch circuit 113 of the first circuit 110. Exemplarily, the first branch circuit 111 has a resistor R1, and no resistor is arranged in the third branch circuit 113, thus the resistance of the first circuit 110 is R1. The terminal controls the second switch component 420 to connect the fifth branch circuit 212 instead of connecting the sixth branch circuit 213, and the fourth branch circuit 211 of the second circuit 210 is connected to the fifth branch circuit 212 of the second circuit 210. Exemplarily, the fourth branch circuit 211 has a resistor R4, and the fifth branch circuit 212 has a resistor R3, thus the resistance of the second circuit 210 is R3+R4.

Taking the eighth resistor R8 being the test resistor as an example for explanation. The electric potential $VISO_+$ at the first terminal of the eighth resistor R8 and the electric potential VISO_ at the second terminal of the eighth resistor R8 are detected, to obtain a second voltage VPP2 across the eighth resistor R8. The voltage across the fourth circuit 220 is calculated based on the eighth resistor R8 and the second voltage, and the voltage across the fourth circuit 220 is the voltage Vn2 across the second voltage-dividing circuit 200 in this state. The voltage Vp2 across the first voltage-dividing circuit 100 in this state is calculated as Vp2=Vbat−Vn2.

In this embodiment, the resistance values of the first insulation impedance Rx and the second insulation impedance Ry are calculated according to following Equations:

$$\frac{(R1+R2)\,//\,(R5+R6)\,//\,Rx}{R4\,//\,(R7+R8)\,//\,Ry}=\frac{Vp1}{Vn1}$$

$$\frac{R1\,//\,(R5+R6)\,//\,Rx}{(R3+R4)\,//\,(R7+R8)\,//\,Ry}=\frac{Vp2}{Vn2}$$

Where, Rx denotes the first insulation impedance Rx, and Ry denotes the second insulation impedance Ry.

R1 denotes the resistance value of the first resistor R1 of the first branch circuit 111 of the first circuit 110, R2 denotes the resistance value of the second resistor R2 of the second branch circuit 112 of the first circuit 110, R3 denotes the resistance value of the third resistor R3 of the fifth branch circuit 212 of the second circuit 210, R4 is the resistance value of the fourth resistor R4 of the fourth branch circuit 211 of the fourth circuit 220, R5 and R6 are the resistance values of the fifth resistor R5 and the sixth resistor R6 connected in series in the third circuit 120 respectively, and R7 and R8 are the resistance values of the seventh resistor R7 and the eighth resistor R8 connected in series in the fourth circuit 220.

In this embodiment, in the normal mode, controlling the switch module 300 to be turned off so that the first circuit 110 and the second circuit 210 are both disconnected, and/or controlling the switch module 300 to be turned off so that the third circuit 120 and the fourth circuit 220 are both disconnected, includes: controlling the switch module 300 to be turned off so that the first voltage-dividing circuit 100 and the second voltage-dividing circuit 200 are both disconnected. The terminal controls the switch module 300 to be turned off so that the first circuit 110, the second circuit 210, the third circuit 120, and the fourth circuit 220 are all disconnected, thus preventing the parallelly connected resistors introduced by the power conversion system from affecting the overall insulation impedance to ground of the power conversion system, which is beneficial to ensuring that the power conversion system has a high insulation impedance to ground, and beneficial to the normal operation of the power conversion system.

In the normal mode, the control method for the power conversion system of the present embodiment controls the power conversion system through the control strategy to disconnect the circuit parallelly connected with the insulation impedance, thereby reducing the parallelly connected resistors introduced by the insulation impedance detection, thereby reducing the influence of the parallelly connected resistors on the overall insulation impedance of the power conversion system. What's more, in the detection mode, the control method of the present embodiment controls the power conversion system through the control strategy to adjust the resistance of the first voltage-dividing circuit 100 and the resistance of the second voltage-dividing circuit 200, so that the voltage across the first voltage-dividing circuit 100 and the voltage across the second voltage-dividing circuit 200 change. The voltage across the first voltage-dividing circuit 100 and the voltage across the second voltage-dividing circuit 200 are obtained by detecting the voltage across the test resistor, and the resistance of the first insulation impedance Rx and the resistance of the second insulation impedance Ry are calculated based on the voltage across the first voltage-dividing circuit 100, the voltage across the second voltage-dividing circuit 200, and the resistors in the power conversion system. The detection method is simple and has high measurement accuracy.

It should be understood that, although various steps in the flowchart of FIG. 4 are shown in sequence according to the indication of the arrows, these steps are not necessarily executed in sequence according to the order indicated by the arrows. Unless there is a clear explanation in this disclosure, the execution of these steps is not strictly limited in an order, and these steps may be executed in other orders. Moreover, at least part of steps in FIG. 4 may include multiple steps or multiple stages, and these steps or stages are not necessarily executed at the same time, but may be executed at different time, and the execution order of these steps or stages is not necessarily to be carried out in sequence, but may be executed in turn or alternately with other steps or at least part of the steps or stages in other steps.

The technical features of the foregoing embodiments may be arbitrarily combined. For brevity, not all possible combinations of the technical features in the foregoing embodiments are described. However, the combinations of these technical features should be considered to be included within the scope of the present disclosure, as long as the combinations are not contradictory.

The embodiments described above are several implementations of the present disclosure, and the description thereof is specific and detailed, but cannot be construed as a limitation to the scope of the present disclosure. It should be noted that for a person of ordinary skill in the art, various modifications and improvements may be made without departing from the concept of the present disclosure, and all these modifications and improvements are all within the protection scope of the present disclosure. Therefore, the protection scope of the present disclosure shall be subject to the appended claims.

What is claimed is:

1. A power conversion system, comprising:

a first voltage-dividing circuit comprising a first circuit, a third circuit and a first insulation impedance connected in parallel between a positive electrode of the power conversion system and a ground;

a second voltage-dividing circuit comprising a second circuit, a fourth circuit, and a second insulation impedance connected in parallel between the ground and a negative electrode of the power conversion system, an output terminal of the first circuit being connected to an input terminal of the second circuit, an output terminal of the third circuit being connected to an input terminal of the fourth circuit, and an output terminal of the first insulation impedance being connected to an input terminal of the second insulation impedance;

a switch module arranged in at least one of the first voltage-dividing circuit and the second voltage-dividing circuit, and a conduction or a disconnection of the at least one of the first circuit and the second circuit being controlled by controlling a conduction or a disconnection of the switch module, and a conduction or a disconnection of at least one of the third circuit and the fourth circuit being controlled by controlling the conduction or the disconnection of the switch module;

a control module connected to the switch module and configured to control the conduction or the disconnection of the switch module to switch a working mode of the power conversion system to be a detection mode or a normal mode; and a detection module connected to the first voltage-dividing circuit or the second voltage-dividing circuit, and configured to, in the detection mode, detect a resistance value of the first insulation impedance and a resistance value of the second insulation impedance.

2. The power conversion system according to claim 1, wherein the switch module comprises:

a first switch unit provided in the first circuit and configured for controlling the conduction or the disconnection of the first circuit;

a second switch unit provided in the second circuit and configured for controlling the conduction or the disconnection of the second circuit;

wherein the control module is connected to and configured to control the first switch unit, the second switch unit, and the detection module;

in the detection mode, the control module is configured to control the first switch unit to be turned on, control the second switch unit to be turned off, and control the detection module to perform a first detection operation to obtain a voltage Vp1 across the first voltage-dividing circuit and a voltage Vn1 across the second voltage-dividing circuit;

the control module is further configured to control the first switch unit to be turned off, control the second switch unit to be turned on, and control the detection module to perform a second detection operation to obtain a voltage Vp2 across the first voltage-dividing circuit and a voltage Vn2 across the second voltage-dividing circuit;

in the normal mode, the control module is configured to control the first switch unit and the second switch unit to be turned off.

3. The power conversion system according to claim 2, wherein the detection module is further configured to calculate the resistance value of the first insulation impedance and the resistance value of the second insulation impedance according to:

$$\frac{R1 // (R5+R6) // Rx}{(R7+R8) // Ry} = \frac{Vp1}{Vn1}, \text{ and } \frac{(R5+R6) // Rx}{R4 // (R7+R8) // Ry} = \frac{Vp2}{Vn2}$$

wherein, Rx denotes the resistance value of the first insulation impedance, and Ry denotes the resistance value of the second insulation impedance; a sign // denotes a connection in parallel;

R1 denotes a resistance value of a first resistor in the first circuit; R4 denotes a resistance value of a fourth resistor in the second circuit; R5 and R6 denote resistance values of a fifth resistor and a sixth resistor connected in series in the third circuit respectively; and R7 and R8 denote a resistance value of a seventh resistor and a resistance value of an eighth resistor connected in series in the fourth circuit respectively.

4. The power conversion system according to claim 2, wherein the switch module further comprising:

a third switch unit provided in the third circuit and configured for controlling the conduction or the disconnection of the third circuit;

a fourth switch unit provided in the fourth circuit and configured for controlling the conduction or the disconnection of the fourth circuit;

wherein the control module is connected to and configured to control the third switch unit and the fourth switch unit;

in the detection mode, the control module is configured to control the third switch unit and the fourth switch unit to be turned on;

in the normal mode, the control module is configured to control the third switch unit and the fourth switch unit to be turned off.

5. The power conversion system according to claim 1, wherein one terminal of the switch module is connected to the ground, and another terminal of the switch module is connected to an output terminal of the first voltage-dividing circuit and an input terminal of the second voltage-dividing circuit;

in the detection mode, the control module is configured to control the switch module to be turned on so that both the first voltage-dividing circuit and the second voltage-dividing circuit are turned on;

in the normal mode, the control module is configured to control the switch module to be turned off so that both the first voltage-dividing circuit and the second voltage-dividing circuit are disconnected.

6. The power conversion system according to claim 5, wherein the first circuit comprises a first branch circuit, a second branch circuit, a third branch circuit and a first switch component; the first branch circuit is connected to the positive electrode of the power conversion system; the second branch circuit and the third branch circuit are connected to the ground; the second branch circuit and the third branch circuit have different resistance values; and the first switch component is configured to control the first branch circuit to be connected to the second branch circuit or to be connected to the third branch circuit to adjust a total resistance of the first circuit;

the second circuit comprises a fourth branch circuit, a fifth branch circuit, a sixth branch circuit and a second switch component; a first terminal of the fourth branch circuit is connected to the negative electrode of the power conversion system; the fifth branch circuit and the sixth branch circuit are connected to the ground; the second switch component is connected to a second terminal of the fourth branch circuit; the fifth branch circuit and the sixth branch circuit have different resistance values; the second switch component is configured to control the fourth branch circuit to be connected to the fifth branch circuit or to be connected to the sixth branch circuit to adjust a total resistance of the second circuit;

the control module is connected to and configured to control the first switch component, the second switch component and the detection module;

in the detection mode, the control module is configured to control the first switch unit to connect the first branch circuit of the first circuit and the second branch circuit of the first circuit, and configured to control the second switch unit to connect the fourth branch circuit of the second circuit and the sixth branch circuit of the second circuit, and configured to control the detection module to perform a first detection operation to obtain a voltage Vp1 across the first voltage-dividing circuit and a voltage Vn1 across the second voltage-dividing circuit;

the control module is further configured to control the first switch unit to connect the first branch circuit of the first circuit and the third branch circuit of the first circuit, and configured to control the second switch unit to connect the fourth branch circuit of the second circuit and the fifth branch circuit of the second circuit, and configured to control the detection module to perform a second detection operation to obtain a voltage Vp2 across the first voltage-dividing circuit and a voltage Vn2 across the second voltage-dividing circuit.

7. The power conversion system according to claim 6, wherein the detection module is further configured to calculate the resistance value of the first insulation impedance and the resistance value of the second insulation impedance according to $$\frac{(R1+R2) // (R5+R6) // Rx}{R4 // (R7+R8) // Ry} = \frac{Vp1}{Vn1}, \text{ and}$$

$$\frac{R1 // (R5+R6) // Rx}{(R3+R4) // (R7+R8) // Ry} = \frac{Vp2}{Vn2}$$

wherein, Rx denotes the resistance value of the first insulation impedance, and Ry denotes the resistance value of the second insulation impedance; a sign // denotes a connection in parallel;

R1 denotes a resistance value of a first resistor in the first branch circuit of the first circuit, R2 denotes a resistance value of a second resistor in the second branch circuit of the first circuit; R3 denotes a resistance value of a third resistor in the fifth branch circuit of the second circuit; R4 denotes a resistance value of a fourth resistor in the fourth branch circuit of the second circuit; R5 and R6 denote resistance values of a fifth resistor and a sixth resistor respectively connected in series in the third circuit; and R7 and R8 denote resistance values of a seventh resistor and an eighth resistor respectively connected in series in the fourth circuit.

8. The power conversion system according to claim 7, wherein a test resistor is any one of the fifth resistor, the sixth resistor, the seventh resistor, and the eighth resistor; and the detection module and the test resistor are connected in parallel.

9. The power conversion system according to claim 1, wherein the switch module comprises at least one of a single-pole double-throw switch, a photocoupler, an optocoupler transistor, or a relay.

10. A control method for a power conversion system of claim 1, comprising in the detection mode, controlling the third circuit and the fourth circuit to be turned on, controlling the switch module to be turned on so that at least one of the first circuit and the second circuit are turned on, and obtaining the resistance value of the first insulation impedance and the resistance value of the second insulation impedance; and in the normal mode, controlling the switch module to be turned off so that the first circuit and the second circuit are both disconnected, and controlling the switch module to be turned off so that the third circuit and the fourth circuit are both disconnected.

11. The control method for the power conversion system according to claim 10, wherein, in the detection mode, controlling the third circuit and the fourth circuit to be turned on, controlling the switch module to be turned on so that at least one of the first circuit and the second circuit are turned on, and obtaining the resistance value of the first insulation impedance and the resistance value of the second insulation impedance, comprises:

controlling a first switch unit arranged in the first circuit to be turned on so that the first circuit is turned on, and controlling a second switch unit arranged in the second circuit to be turned off so that the second circuit is disconnected, and performing a first detection operation to obtain a voltage Vp1 across the first voltage-dividing circuit and a voltage Vn1 across the second voltage-dividing circuit; and controlling the first switch unit to be turned off so that the first circuit is turned off, and controlling the second switch unit to be turned on so that the second circuit is turned on, and performing a second detection operation to obtain a voltage Vp2 across the first voltage-dividing circuit and a voltage Vn2 across the second voltage-dividing circuit.

12. The control method for the power conversion system according to claim 11, further comprising calculating the resistance value of the first insulation impedance and the resistance value of the second insulation impedance according to:

$$\frac{R1\,//\,(R5+R6)\,//\,Rx}{(R7+R8)\,//\,Ry}=\frac{Vp1}{Vn1},\ \text{and}\ \frac{(R5+R6)\,//\,Rx}{R4\,//\,(R7+R8)\,//\,Ry}=\frac{Vp2}{Vn2}$$

wherein, Rx denotes the resistance value of the first insulation impedance, and Ry denotes the resistance value of the second insulation impedance; a sign // denotes a connection in parallel;

R1 denotes a resistance value of a first resistor in the first circuit; R4 denotes a resistance value of a fourth resistor in the second circuit; R5 and R6 denote resistance values of a fifth resistor and a sixth resistor connected in series in the third circuit respectively; and R7 and R8 denote a resistance value of a seventh resistor and a resistance value of an eighth resistor connected in series in the fourth circuit respectively.

13. The control method for the power conversion system according to claim 11, wherein in the normal mode, controlling the switch module to be turned off so that the first circuit and the second circuit are both disconnected, comprises: controlling the first switch unit to be turned off so that the first circuit is disconnected, and controlling the second switch unit to be turned off so that the second circuit is disconnected.

14. The control method for the power conversion system according to claim 11, wherein in the detection mode, controlling the third circuit and the fourth circuit to be both turned on comprises: controlling a third switch unit arranged in the third circuit and a fourth switch unit arranged in the fourth circuit both to be turned on.

15. The control method for the power conversion system according to claim 14, wherein controlling the switch module to be turned off so that the third circuit and the fourth circuit are both controlled to be disconnected, comprises controlling the third switch unit and the fourth switch unit to be turned off.

16. The control method for the power conversion system according to claim 10, wherein, in the detection mode, controlling the third circuit and the fourth circuit to be turned on, controlling the switch module to be turned on so that at least one of the first circuit and the second circuit are turned on, and obtaining the resistance value of the first insulation impedance and the resistance value of the second insulation impedance, comprises:

controlling the switch module to be turned on so that both the first voltage-dividing circuit and the second voltage-dividing circuit are turned on;

controlling the first switch component to connect the first branch circuit of the first circuit and the second branch circuit of the first circuit, and controlling the second switch component to connect the fourth branch circuit of the second circuit and the sixth branch circuit of the second circuit, performing a first detection operation, and obtaining a voltage Vp1 across the first voltage-dividing circuit and a voltage Vn1 across the second voltage-dividing circuit;

controlling the first switch component to connect the first branch circuit of the first circuit and the third branch circuit of the first circuit, controlling the second switch component to connect the fourth branch circuit of the second circuit and the fifth branch circuit of the second circuit, performing a second detection operation, and obtaining a voltage Vp2 across the first voltage-dividing circuit and a voltage Vn2 across the second voltage-dividing circuit.

17. The control method for the power conversion system according to claim 16, further comprising calculating the resistance value of the first insulation impedance and the resistance value of the second insulation impedance according to:

$$\frac{(R1+R2)\,//\,(R5+R6)\,//\,Rx}{R4\,//\,(R7+R8)\,//\,Ry}=\frac{Vp1}{Vn1},\ \text{and}$$

$$\frac{R1\,//\,(R5+R6)\,//\,Rx}{(R3+R4)\,//\,(R7+R8)\,//\,Ry}=\frac{Vp2}{Vn2}$$

wherein, Rx denotes the resistance value of the first insulation impedance, and Ry denotes the resistance value of the second insulation impedance; a sign // denotes a connection in parallel;

R1 denotes a resistance value of a first resistor in the first branch circuit of the first circuit, R2 denotes a resistance value of a second resistor in the second branch circuit of the first circuit; R3 denotes a resistance value of a third resistor in the fifth branch circuit of the second circuit; R4 denotes a resistance value of a fourth resistor in the fourth branch circuit of the second circuit; R5 and R6 denote resistance values of a fifth resistor and a sixth resistor respectively connected in series in the third circuit; and R7 and R8 denote resistance values of a seventh resistor and an eighth resistor respectively connected in series in the fourth circuit.

18. The control method for the power conversion system according to claim 16, wherein in the normal mode, controlling the switch module to be turned off so that the first circuit and the second circuit are both disconnected, and controlling the switch module to be turned off so that the third circuit and the fourth circuit are both disconnected, comprise: controlling the switch module to be turned off so that the first voltage-dividing circuit and the second voltage-dividing circuit are disconnected.

19. The control method for the power conversion system according to claim 11, wherein performing the first detection operation to obtain the voltage Vp1 across the first voltage-dividing circuit and the voltage Vn1 across the second voltage-dividing circuit comprises:

detecting a first voltage across a first terminal of a test resistor and a second terminal of the test resistor, the test resistor being a resistor arranged in the third circuit or in the fourth circuit; and obtaining the voltage Vp1 across the first voltage-dividing circuit and the voltage Vn1 across the second voltage-dividing circuit according to the first voltage.

20. The control method for the power conversion system according to claim 11, wherein performing the second detection operation to obtain the voltage Vp2 across the first voltage-dividing circuit and the voltage Vn2 across the second voltage-dividing circuit, comprises:

detecting a second voltage across a first terminal of a test resistor and a second terminal of the test resistor, where the test resistor is a resistor arranged in the third circuit or in the fourth circuit; and obtaining the voltage Vp2 across the first voltage-dividing circuit and the voltage Vn2 across the second voltage-dividing circuit according to the second voltage.

* * * * *